US012183612B2

(12) United States Patent
Hatano et al.

(10) Patent No.: US 12,183,612 B2
(45) Date of Patent: Dec. 31, 2024

(54) SUBSTRATE TRANSFER APPARATUS, SUBSTRATE TRANSFER METHOD, AND SUBSTRATE PROCESSING SYSTEM

(71) Applicant: TOKYO ELECTRON LIMITED, Tokyo (JP)

(72) Inventors: Tatsuo Hatano, Yamanashi (JP); Naoki Watanabe, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 350 days.

(21) Appl. No.: 17/573,387

(22) Filed: Jan. 11, 2022

(65) Prior Publication Data

US 2022/0223447 A1 Jul. 14, 2022

(30) Foreign Application Priority Data

Jan. 12, 2021 (JP) ................. 2021-002579

(51) Int. Cl.
*H01L 21/67* (2006.01)
*H01L 21/677* (2006.01)
(Continued)

(52) U.S. Cl.
CPC .. *H01L 21/67742* (2013.01); *H01L 21/67173* (2013.01); *H01L 21/67196* (2013.01);
(Continued)

(58) Field of Classification Search
CPC ......... H01L 21/67742; H01L 21/67173; H01L 21/67196; H01L 21/67201; H01L 21/67259; H01L 21/67709; H01L 21/6838; H01L 21/68707; H01L 21/68; H02K 41/031; H02K 2201/18

See application file for complete search history.

(56) References Cited

U.S. PATENT DOCUMENTS 9,227,320 B2 1/2016 Hiroki et al.
10,042,356 B2 8/2018 Iida et al.
(Continued)

FOREIGN PATENT DOCUMENTS

CN 105826218 A 8/2016
CN 108364898 A 8/2018
(Continued)

*Primary Examiner* — Michael W Choi
(74) *Attorney, Agent, or Firm* — Fenwick & West LLP

(57) ABSTRACT

A substrate transfer apparatus for transferring a substrate is disclosed. The apparatus comprises: a transfer unit including a substrate holder configured to hold a substrate, and a base having therein a magnet and configured to move the substrate holder; a planar motor including a main body, a plurality of electromagnetic coils disposed in the main body, and a linear driver configured to supply a current to the electromagnetic coils, and magnetically levitate and linearly drive the base; a substrate detection sensor configured to detect the substrate when the substrate held by the substrate holder passes by; and a transfer controller configured to calculate an actual position of the substrate held by the substrate holder based on detection data of the substrate detection sensor, calculate correction values for a logical position that has been set, and correct a transfer position of the substrate based on the correction values.

12 Claims, 7 Drawing Sheets

(51) Int. Cl.
*H01L 21/683* (2006.01)
*H01L 21/687* (2006.01)
*H02K 41/03* (2006.01)
*H01L 21/68* (2006.01)

(52) U.S. Cl.
CPC .. *H01L 21/67201* (2013.01); *H01L 21/67259* (2013.01); *H01L 21/67709* (2013.01); *H01L 21/6838* (2013.01); *H01L 21/68707* (2013.01); *H02K 41/031* (2013.01); *H01L 21/68* (2013.01); *H02K 2201/18* (2013.01)

(56) References Cited

U.S. PATENT DOCUMENTS

| | | |
|---|---|---|
| 10,056,279 B2 | 8/2018 | Janakiraman et al. |
| 10,395,968 B2 | 8/2019 | Kuwahara |
| 10,734,265 B2 | 8/2020 | Janakiraman et al. |
| 11,081,377 B2 | 8/2021 | Goto et al. |
| 2013/0177857 A1* | 7/2013 | Shibazaki ............ G03F 7/7075 414/754 |
| 2015/0019004 A1 | 1/2015 | Hiroki et al. |
| 2015/0235888 A1 | 8/2015 | Iida et al. |
| 2016/0218029 A1 | 7/2016 | Janakiraman et al. |
| 2018/0218935 A1 | 8/2018 | Kuwahara |
| 2018/0308735 A1 | 10/2018 | Janakiraman et al. |
| 2020/0118851 A1 | 4/2020 | Goto et al. |

FOREIGN PATENT DOCUMENTS

| | | |
|---|---|---|
| JP | H06-120317 A | 4/1994 |
| JP | 2004-193344 A | 7/2004 |
| JP | 2006-248628 A | 9/2006 |
| JP | 2013-211317 A | 10/2013 |
| JP | 2015-156437 A | 8/2015 |
| JP | 2017-168866 A | 9/2017 |
| JP | 2018-504784 A | 2/2018 |
| JP | 2020-061472 A | 4/2020 |
| KR | 10-2017-0106464 A | 9/2017 |
| WO | WO 2016/118335 A1 | 7/2016 |

* cited by examiner

*FIG.8A*      *FIG.8B*
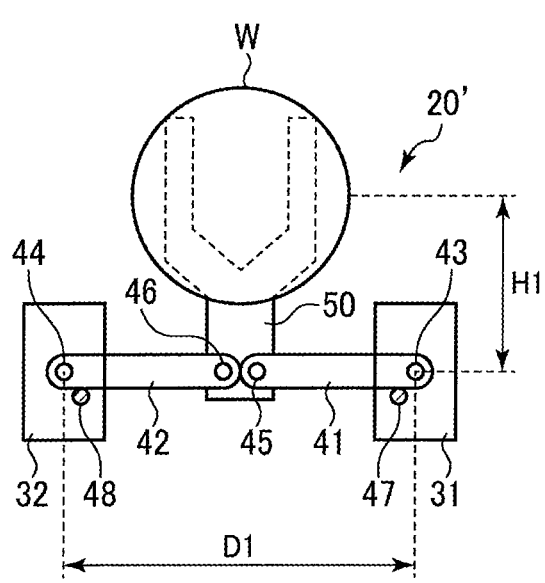
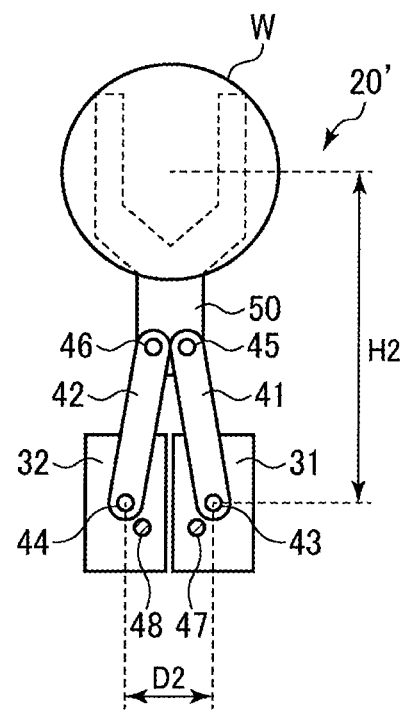

SUBSTRATE TRANSFER APPARATUS, SUBSTRATE TRANSFER METHOD, AND SUBSTRATE PROCESSING SYSTEM

CROSS-REFERENCE TO RELATED APPLICATIONS

This application claims priority to Japanese Patent Application No. 2021-002579 filed on Jan. 12, 2021, the entire contents of which are incorporated herein by reference.

TECHNICAL FIELD

The present disclosure relates to a substrate transfer apparatus, a substrate transfer method, and a substrate processing system.

BACKGROUND

For example, in a semiconductor manufacturing process, when a semiconductor wafer, which is a substrate, is processed, a substrate processing system including a plurality of processing chambers, a vacuum transfer chamber connected to the processing chambers, and a substrate transfer apparatus disposed in the vacuum transfer chamber is used.

As such a substrate transfer apparatus, a transfer robot having an articulated arm structure has been conventionally used (see, e.g., Japanese Laid-open Patent Publication No. 2017-168866). However, a technique using a transfer robot has a problem such as gas intrusion from a vacuum seal or limitation of movement of the transfer robot. Therefore, a substrate transfer apparatus (see, e.g., Japanese Laid-open Patent Publication No. 2018-504784) using a planar motor utilizing magnetic levitation is suggested as a technique capable of solving the above-described problem.

SUMMARY

The present disclosure provides a substrate transfer apparatus, a substrate transfer method, and a substrate processing system capable of transferring a substrate to a transfer position in a processing chamber with high positioning accuracy using a planar motor.

To this end, a substrate transfer apparatus for transferring a substrate is disclosed. The apparatus comprises: a transfer unit including a substrate holder configured to hold a substrate, and a base having therein a magnet and configured to move the substrate holder; a planar motor including a main body, a plurality of electromagnetic coils disposed in the main body, and a linear driver configured to supply a current to the electromagnetic coils, and magnetically levitate and linearly drive the base; a substrate detection sensor configured to detect the substrate when the substrate held by the substrate holder passes by; and a transfer controller configured to calculate an actual position of the substrate held by the substrate holder based on detection data of the substrate detection sensor, calculate correction values for a logical position that has been set, and correct a transfer position of the substrate based on the correction values.

BRIEF DESCRIPTION OF THE DRAWINGS

The objects and features of the present disclosure will become apparent from the following description of embodiments, given in conjunction with the accompanying drawings, in which:

FIGS. 8A and 8B are plan views showing a transfer unit in another example of the substrate transfer apparatus.

DETAILED DESCRIPTION

Hereinafter, embodiments will be described in detail with reference to the accompanying drawings.

Figure 1:
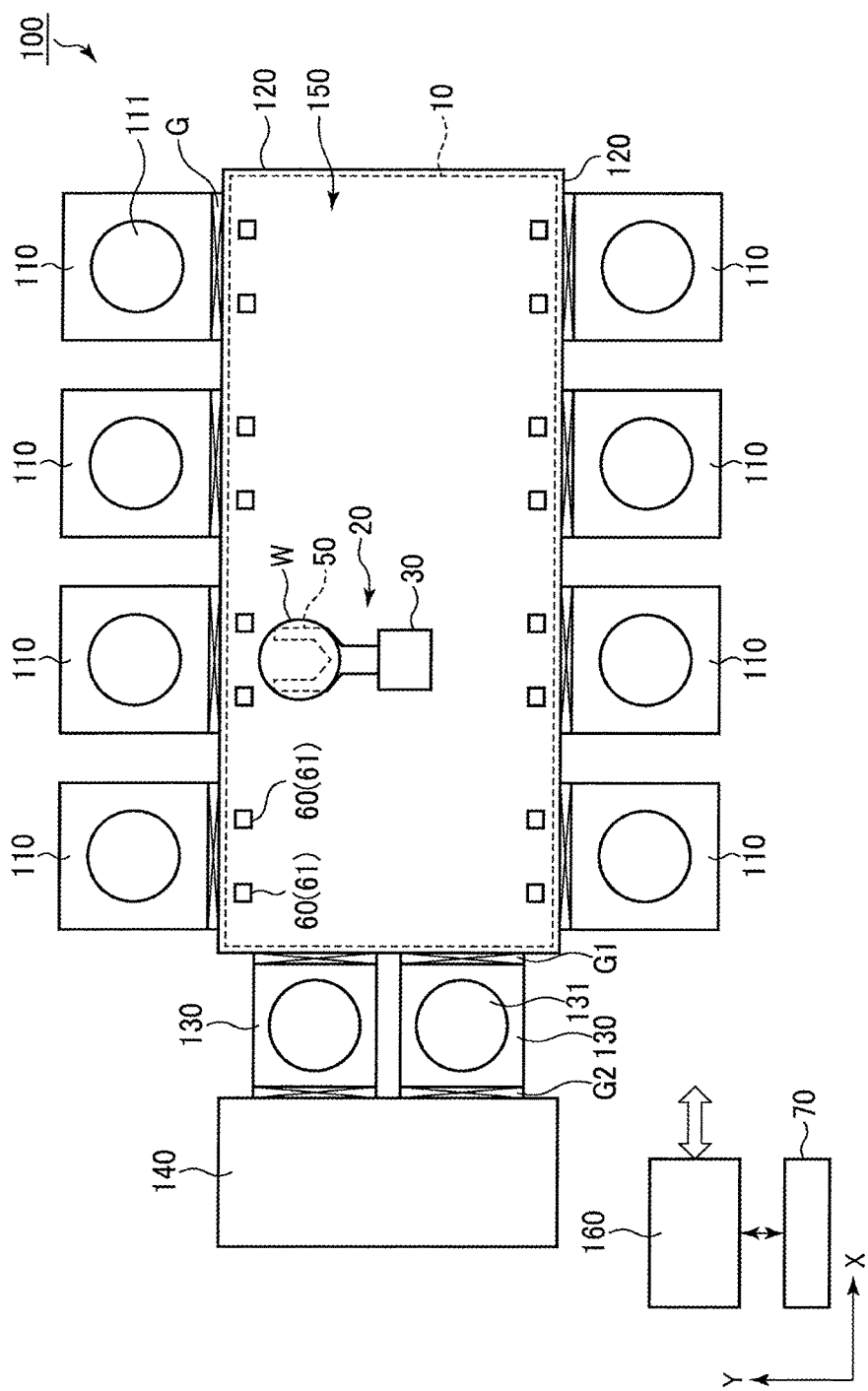
FIG. 1 is a schematic plan view showing a substrate processing system according to a first embodiment.

FIG. 1 is a schematic plan view showing a substrate processing system according to an embodiment.

A substrate processing system 100 of the present embodiment continuously performs processing on a plurality of substrates. The substrate processing is not particularly limited, and may include various treatments such as film formation, etching, ashing, cleaning, and the like. The substrate is not particularly limited. However, in the following description, a case where a semiconductor wafer (hereinafter, simply referred to as "wafer") is used as the substrate will be described as an example.

As shown in FIG. 1, the substrate processing system 100 is a cluster structure (multi-chamber type) system, and includes a plurality of processing chambers 110, a vacuum transfer chamber 120, load-lock chambers 130, an atmosphere transfer chamber 140, a substrate transfer apparatus 150, and a controller 160.

The vacuum transfer chamber 120 has a rectangular planar shape. The inside of the vacuum transfer chamber 120 is depressurized to a vacuum atmosphere. A plurality of processing chambers 110 are connected to two opposing walls on long sides of the vacuum transfer chamber 120 through gate valves G. Further, two load-lock chambers 130 are connected to one wall on a short side of the vacuum transfer chamber 120 through gate valves G1. The atmosphere transfer chamber 140 is connected to the sides of the two load-lock chambers 130, which sides are opposite to the sides connected to the vacuum transfer chamber 120, through gate valves G2. In FIG. 1, the arrangement direction of the processing chambers 110 is defined as the X direction, and the direction orthogonal to the X direction is defined as the Y direction.

The substrate transfer apparatus 150 in the vacuum transfer chamber 120 loads and unloads the wafer W, which is a substrate, into and from the processing chambers 110 and the load-lock chambers 130. The substrate transfer apparatus 150 includes a transfer unit 20 having an end effector 50 that is a wafer holder that actually holds the wafer W, and wafer detection sensors 60. The substrate transfer apparatus 150 will be described in detail later.

By opening the gate valves G, the communication between the processing chambers 110 and the vacuum transfer chamber 120 is allowed and the wafer W can be transferred therebetween by the substrate transfer apparatus 150. By closing the gate valves G, the communication therebetween is blocked. By opening the gate valves G1, the communication between the load-lock chambers 130 and the vacuum transfer chamber 120 is allowed and the wafer W can be transferred by the substrate transfer apparatus 150. By closing the gate valves G1, the communication therebetween is blocked.

Each of the processing chambers 110 has a placement table 111 on which the wafer W is placed, and desired processing (film formation, etching, ashing, cleaning or the like) is performed on the wafer W placed on the placement table 111 in a state where the inner atmosphere of the processing chamber 110 is depressurized to a vacuum atmosphere.

Each of the load-lock chambers 130 has therein a placement table 131 on which the wafer W is placed, and the pressure in each load-lock chamber 130 is controlled between an atmospheric pressure and a vacuum level at the time of transferring the wafer W between the atmospheric transfer chamber 140 and the vacuum transfer chamber 120.

The atmospheric transfer chamber 140 is set to an atmospheric atmosphere. For example, a downflow of clean air is formed in the atmospheric transfer chamber 140. Further, a load port (not shown) is disposed on a wall surface of the atmosphere transfer chamber 140. A carrier (not shown) accommodating wafers W or an empty carrier is connected to the load port. The carrier may be, e.g., a front opening unified pod (FOUP) or the like.

Further, an atmospheric transfer device (not shown) for transferring the wafer W is disposed in the atmospheric transfer chamber 140. The atmospheric transfer device takes out the wafer W accommodated in the load port (not shown) and places it on the placement table 131 of the load-lock chamber 130, or takes the wafer W placed on the placement table 131 of the load-lock chamber 130 and accommodates it in the load port. By opening the gate valves G2, the communication between the load-lock chambers 130 and the atmospheric transfer chamber 140 is allowed and the wafer W can be transferred by the atmospheric transfer device. By closing the gate valves G2, the communication therebetween is blocked.

The controller 160 is a computer, and includes a main controller having a CPU, an input device, an output device, a display device, and a storage device (storage medium). The main controller controls operations of individual components of the substrate processing system 100. For example, the main controller controls the processing of the wafer W in each processing chamber 110, the opening/closing of the gate valves G, G1 and G2, and the like. The main controller controls the individual components based on a processing recipe that is a control program stored in the storage medium (hard disk, optical disk, semiconductor memory, or the like) built in the storage device.

Further, in the present embodiment, the controller 160 controls a transfer controller 70 which is a part of the substrate transfer apparatus 150. The transfer controller 70 will be described later together with the substrate transfer apparatus 150 to be described later.

Next, an example operation of the substrate processing system 100 will be described. Here, an operation of processing the wafer W accommodated in the carrier attached to the load port in the processing chamber 110 and accommodating the wafer W in an empty carrier attached to the load port will be described as an example of the operation of the substrate processing system 100. The following operations are executed based on the processing recipe of the controller 160.

First, the wafer W is taken out from the carrier connected to the load port by the atmospheric transfer device (not shown) in the atmospheric transfer chamber 140. Then, the gate valve G2 is opened so that the wafer W is loaded into the load-lock chamber 130 in an atmospheric atmosphere. Then, the gate valve G2 is closed, and the load-lock chamber 130 into which the wafer W has been loaded is set to a vacuum state corresponding to that of the vacuum transfer chamber 120. Next, the corresponding gate valve G1 is opened so that the wafer W in the load-lock chamber 130 is taken out by the end effector 50 of the transfer unit 20 and, then, the gate valve G1 is closed. Next, the gate valve G corresponding to one of the processing chambers 110 is opened, and the wafer W is loaded into that processing chamber 110 by the end effector 50 and placed on the placement table 111. Thereafter, the end effector 50 is retracted from the processing chamber 110, and the gate valve G is closed. Then, processing such as film formation or the like is performed in the processing chamber 110.

After the processing in the processing chamber 110 is completed, the corresponding gate valve G is opened, and the end effector 50 of the transfer unit 20 takes out the wafer W from the processing chamber 110. Then, the gate valve G is closed, and the gate valve G1 is opened so that the wafer W held by the end effector 50 is transferred to the load-lock chamber 130. Thereafter, the gate valve G1 is closed, and the load-lock chamber 130 into which the wafer W has been loaded is set to an atmospheric atmosphere. Then, the gate valve G2 is opened, and the wafer W is taken out from the load-lock chamber 130 by an atmospheric transfer device (not shown). The wafer W is accommodated in the carrier of the load port (all not shown).

The above processes are simultaneously performed on a plurality of wafers W, and all the wafers W in the carrier are processed.

Although the case of parallel transfer in which one wafer W is transferred to one of the processing chambers 110 by the substrate transfer apparatus 150 and another wafer W is transferred to another processing chamber 110 at the same time has been described, the present disclosure is not limited thereto. For example, serial transfer in which one wafer W is sequentially transferred to the multiple processing chambers 110 may be performed.

(Example of Substrate Transfer Apparatus)

Figure 2:
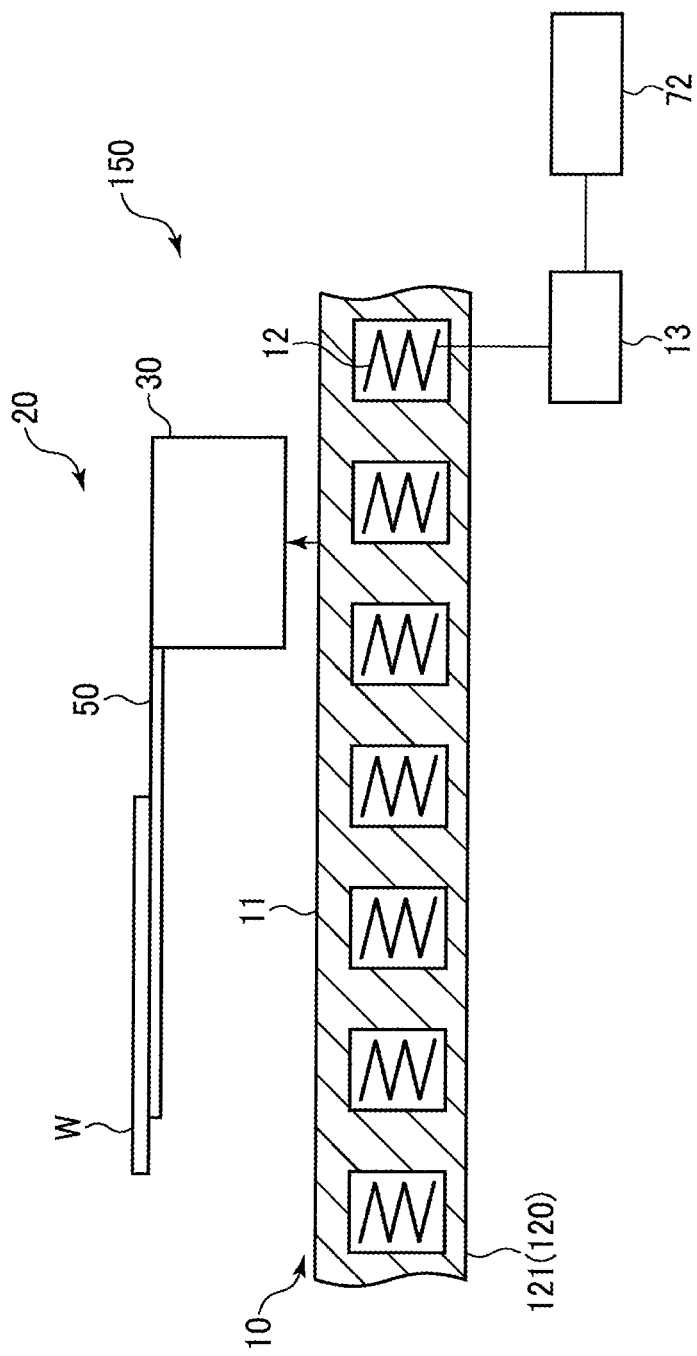
FIG. 2 is a cross-sectional view for explaining a transfer unit and a planar motor in an example of a substrate transfer apparatus.
Figure 3:
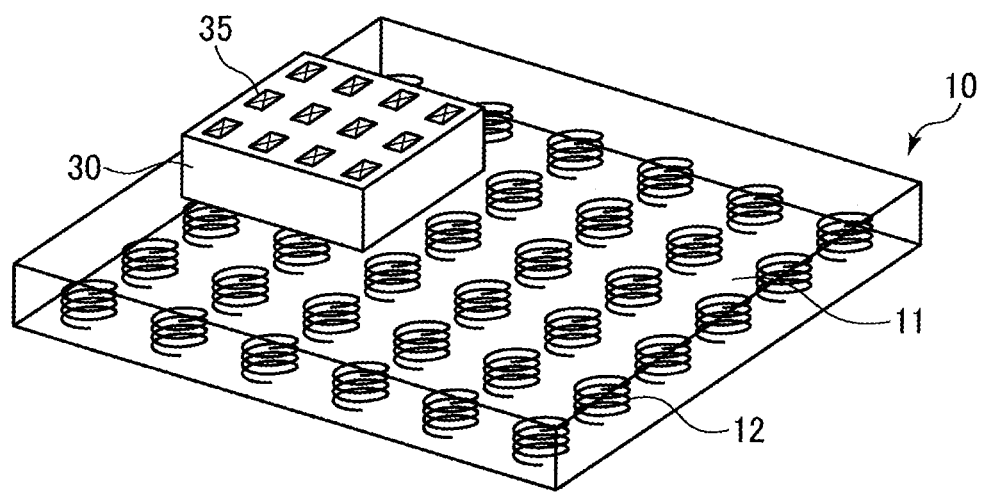
FIG. 3 is a perspective view for explaining a driving principle of a planar motor.
Figure 4:
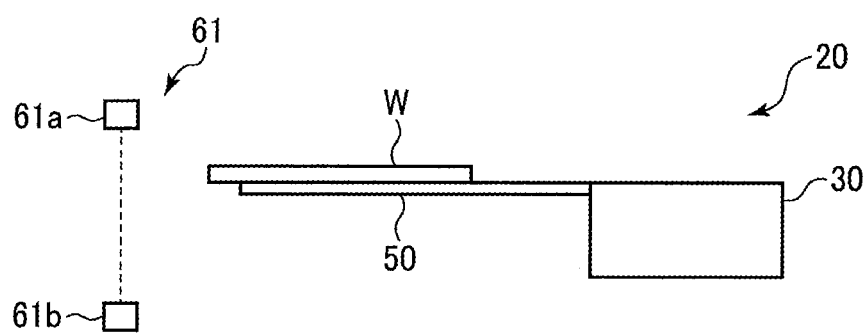
FIG. 4 is a side view for explaining a wafer detection sensor.
Figure 5:
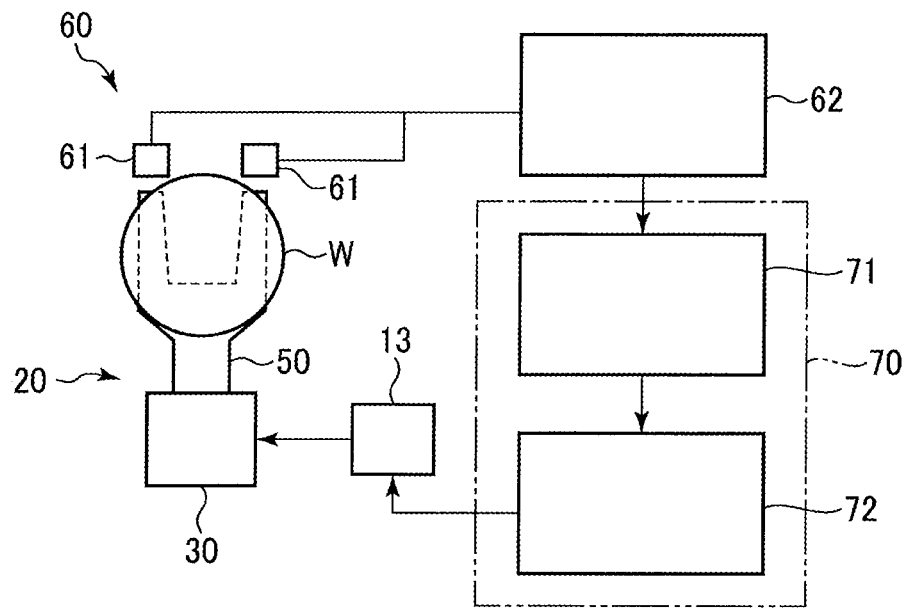
FIG. 5 is a block diagram for explaining a control system of the substrate transfer apparatus.

Next, an example of the substrate transfer apparatus will be described in detail with reference to FIGS. 2 to 5 in addition to FIG. 1. FIG. 2 is a cross-sectional view for explaining a transfer unit and a planar motor in an example of a substrate transfer apparatus. FIG. 3 is a perspective view for explaining a driving principle of a planar motor. FIG. 4 is a side view for explaining a wafer detection sensor. FIG. 5 is a block diagram for explaining a control system of the substrate transfer apparatus.

As shown in FIG. 1, the substrate transfer apparatus 150 includes a planar motor (linear unit) 10, a transfer unit 20, a wafer detection sensor 60, and a transfer controller 70.

The planar motor (linear unit) 10 linearly drives the transfer unit 20. The planar motor (linear unit) 10 includes a main body 11 that constitutes a bottom wall 121 of the vacuum transfer chamber 120, a plurality of electromagnetic coils 12 arranged throughout in the main body 11, and a linear driver 13 for linearly driving the transfer unit 20 by supplying a current to each of the plurality of electromagnetic coils 12. The linear driver 13 is controlled by a planar motor controller 72 of the transfer controller 70. A magnetic field is generated by supplying a current to the electromagnetic coils 12.

The transfer unit 20 has the end effector 50 that is a wafer holder for holding the wafer W, and a base 30. Although one transfer unit 20 is illustrated in the drawing, two or more transfer units 20 may be provided.

As shown in FIG. 3, the base 30 has therein a plurality of permanent magnets 35 and is driven by the planar motor (linear unit) 10. The end effector 50 is moved as the base 30 is driven. By setting the direction of the current supplied to the electromagnetic coils 12 of the planar motor (linear unit) 10 to a direction such that the magnetic field generated by the current repels the permanent magnets 35, the base 30 is magnetically levitated from the surface of the main body 11. By stopping the supply of the current to the electromagnetic coils 12, the levitation of the base 30 is stopped and the base 30 is placed on the bottom surface of the vacuum transfer chamber 120, i.e., on the surface of the main body 11 of the planar motor 10. Further, by individually controlling the current supplied from the linear driver 13 to the electromagnetic coils 12 using the planar motor controller 72, it is possible to move the base 30 along the surface of the planar motor 10 and control the position of the base 30 in a state where the base 30 is magnetically levitated. Further, the amount of levitation can be controlled by controlling the current.

The wafer detection sensor 60 has two sensor elements 61 disposed at portions in the vacuum transfer chamber 120 corresponding to the wafer loading/unloading port of each processing chamber 110. As shown in FIG. 4, the sensor element 61 has, e.g., a light emitting element 61*a* and a light receiving element 61*b* arranged in a vertical direction, and constitutes an optical sensor. The wafer W is detected when the wafer W passes through the space between the light emitting element 61*a* and the light receiving element 61*b*. As shown in FIG. 5, the wafer detection sensor 60 has a measurement part 62 that receives and measures a signal from the sensor element 61.

The transfer controller 70 includes a calculator 71 and the above-described planar motor controller 72. The calculator 71 acquires a signal from the measurement part 62 of the wafer detection sensor 60, calculates an actual position of the wafer W on the end effector 50, and calculates correction values from the logical position of the wafer position based on the calculation result. The planar motor controller 72 corrects the transfer position of the wafer W on the placement table 111 of the processing chamber 110 based on the correction values, and controls the linear driver 13 to transfer the wafer W to the corrected transfer position.

In the substrate transfer apparatus 150 configured as described above, the base 30 is magnetically levitated by generating magnetic field that repels the permanent magnets 35 by controlling the current supplied from the linear driver 13 of the planar motor (linear unit) 10 to the electromagnetic coils 12 using the planar motor controller 72. The amount of levitation at this time can be controlled by controlling the current.

By individually controlling the current supplied from the linear driver 13 to the electromagnetic coils 12 in a state where the base 30 is magnetically levitated, it is possible to move the base 30 along the surface of the main body 11 of the planar motor 10 (the bottom surface of the vacuum transfer chamber 120), and control the position of the base 30. Accordingly, the transfer unit 20 can be moved and rotated.

In the case of loading the wafer W into the processing chamber 110 by the transfer unit 20, the base 30 is moved to locate the end effector 50 at a position corresponding to the processing chamber 110 in a state where the wafer W placed on the end effector 50. Then, the gate valve G is opened, and the base 30 is further moved to insert the end effector 50 into the processing chamber 110. Accordingly, the wafer W is delivered to the placement table 111 in the processing chamber 110.

At this time, the transfer controller 70 controls the position of the base 30 based on the pre-obtained position data, and transfers the wafer W to a target position on the placement table 111 in the processing chamber 110. However, the wafer W may be placed on the end effector 50 while being deviated from a preset position.

Figure 6:
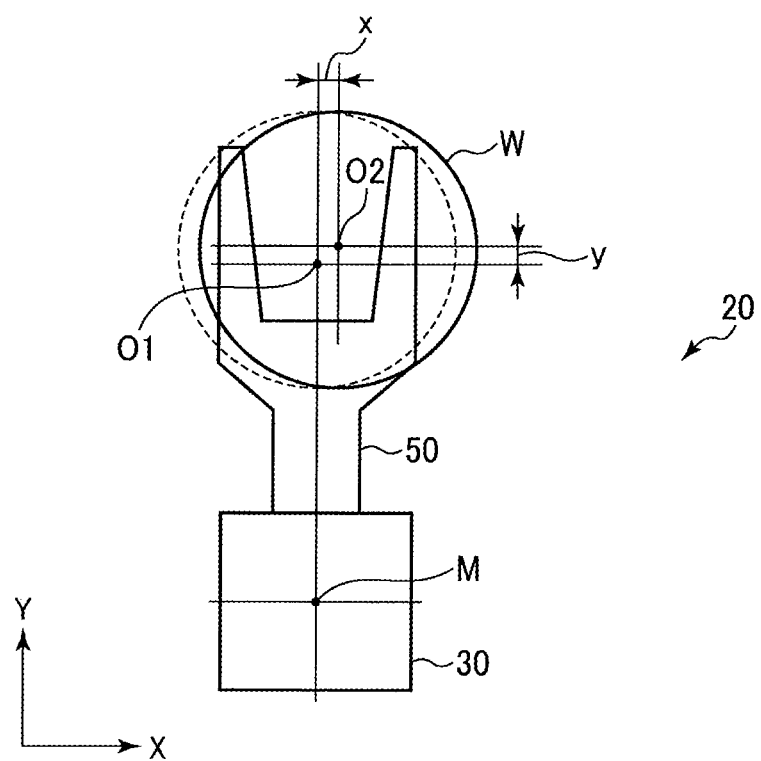
FIG. 6 is a plan view showing a logical center of a wafer on an end effector and a physical center of a wafer that is actually placed on the end effector.

Specifically, as shown in FIG. 6, the transfer controller 70 sets a logical center O1 as a center position of the wafer W placed on the end effector 50, and controls a position of a center M of the base 30 that is a linear driving center based on the logical center O1. However, a position of a physical center O2 of the wafer W actually placed on the end effector 50 may be deviated from the position of the logical center O1. The example of FIG. 6 shows a state in which the physical center O2 of the wafer W placed on the end effector 50 is deviated from the logical center O1 by the amount of x in the X direction and the amount of y in the Y direction.

In the linear driving using the planar motor 10, the central axis used by the conventional transfer robot is not used, so that it is not possible to perform transfer correction with the central axis as a reference point. Therefore, when the wafer W is placed in a deviated position on the end effector 50, the wafer W is placed in a position deviated from a transfer target position on the placement table 111 even if the transfer controller 70 controls the transfer position of the wafer W.

As described above, the substrate transfer using the planar motor solves the problem of the technique using the transfer robot, such as gas intrusion from the vacuum seal or limitation of the movement of the transfer robot. However, recently, due to a growing demand for miniaturization of devices, the demand for placement accuracy of the substrate (wafer) on the placement table in the processing chamber is increasing in order to improve uniformity and characteristics. The processing of the substrate (wafer) includes high-temperature processing and low-temperature processing. In that case, the positional misalignment of the substrate on the end effector tends to be large due to the difference in thermal expansion. Therefore, the positional misalignment with respect to the transfer target position occurs due to the positional misalignment of the substrate on the end effector.

Therefore, in the present embodiment, the sensor elements 61 of the wafer detection sensor 60 are disposed at portions in the vacuum transfer chamber 120 corresponding to the wafer loading/unloading port of each processing chamber 110, and the position of the wafer W is detected by the sensor elements 61 at the time of transferring the wafer on the end effector 50 to the placement table 111 in the processing chamber 110. Then, based on the detection data, the calculator 71 of the transfer controller 70 calculates the actual position of the wafer W on the end effector 50, and calculates the correction values from the logical position of the wafer position based on the calculation result. The planar motor controller 72 corrects the transfer position of the wafer W on the placement table 111 in the processing chamber 110 based on the correction values. Then, the linear driver 13 is controlled to transfer the wafer W to the corrected transfer position.

Figure 7:
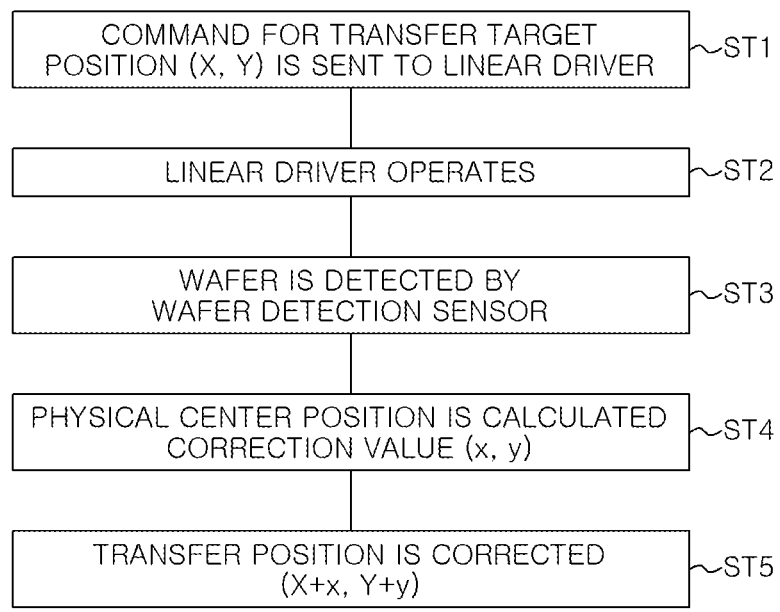
FIG. 7 is a flowchart showing an example of a wafer transfer sequence executed by a transfer controller.

FIG. 7 shows an example of a sequence executed by the transfer controller 70 in that case.

First, a command for center coordinates (X,Y) of the wafer W corresponding to the transfer target position is given to the linear driver 13 (step ST1). The transfer target position indicates a position on the placement table 111 in the processing chamber 110.

Next, the linear driver 13 is operated based on the command (step ST2). Accordingly, the base 30 of the transfer unit 20 is moved, and the wafer W on the end effector 50 is transferred. Specifically, the wafer W held by the end effector 50 is transferred in the X direction to a position corresponding to a target processing chamber 110, and transferred in the Y direction toward the target processing chamber 110.

Next, the wafer W is detected by the wafer detection sensor 60 (step ST3). Specifically, the two sensor elements 61 detect the wafer W passing therebetween, and the detection signal is measured by the measurement part 62.

Next, the physical center position O2 of the wafer W on the end effector 50 is calculated based on the detection data of the wafer detection sensor 60, and the correction values (x,y) from the logical center O1 are calculated (step ST4).

Next, the center coordinates of the wafer W corresponding to the transfer position of the wafer W are corrected to (X+x, Y+y) based on the correction values (x,y) (step ST5). The linear driver 13 is transfer-controlled based on the corrected transfer position.

Accordingly, the wafer W can be transferred with high positioning accuracy to a preset transfer position on the placement table 111 in the processing chamber 110.

The wafer detection sensor 60 (the sensor elements 61) is disposed in each processing chamber 110, and the same position correction is performed whenever the wafer W is transferred to each processing chamber 110.

Such position correction can be performed in the same manner regardless of whether the wafers W are transferred in parallel or serial.

(Another Example of Substrate Transfer Apparatus)

Figure 9:
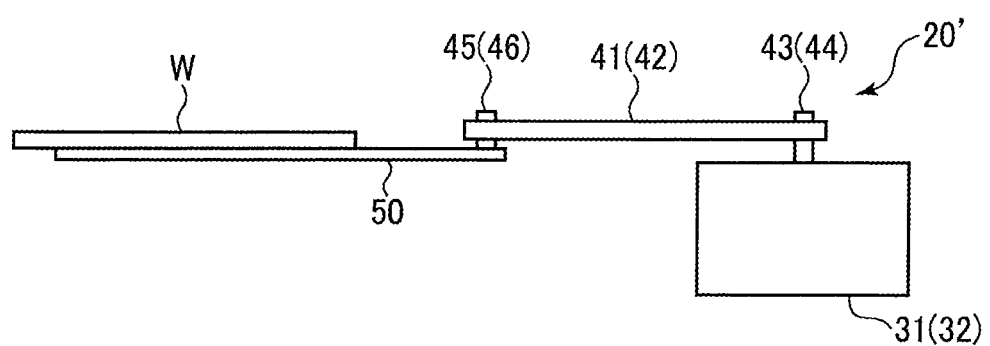
FIG. 9 is a side view showing a transfer unit in another example of the substrate transfer apparatus.

Next, another example of the substrate transfer apparatus will be described. This example is different from the above example in the configuration of the transfer unit. FIGS. 8A and 8B are plan views showing the transfer unit of the substrate transfer apparatus of this example. FIG. 9 is a side view showing the transfer unit of the substrate transfer apparatus of this example. FIGS. 8A and 8B show different states of the transfer unit.

A transfer unit 20' of this example has two bases 31 and 32, a link mechanism (links 41 and 42), and the end effector 50.

Similarly to the base 30 of the above example, the bases 31 and 32 have therein a plurality of permanent magnets 35 (see FIG. 3), and the end effector 50 is moved via the link mechanism (the links 41 and 42). By setting the direction of the current supplied to the electromagnetic coils 12 of the planar motor (linear unit) 10 to the direction such that the magnetic field generated by the current repels the permanent magnets 35, the bases 31 and 32 are magnetically levitated from the surface of the main body 11.

The links 41 and 42 constituting the link mechanism connect the two bases 31 and 32 with the end effector 50. Specifically, one end of the link 41 is rotatably connected to the base 31 via a vertical rotation shaft 43. The other end of the link 41 is rotatably connected to the end effector 50 via a vertical rotation shaft 45. One end of the link 42 is rotatably connected to the base 32 via a vertical rotation shaft 44. The other end of the link 42 is rotatably connected to the end effector 50 via a vertical rotation shaft 46.

Further, the link mechanism may be configured to be moved while adjusting a link angle. For example, the link mechanism may include an angle co-adjusting mechanism (not shown) for adjusting an angle formed by the extension direction of the end effector 50 (direction orthogonal to a line that connects the rotation shafts 45 and 46) and an angle formed by the extension direction of the end effector 50 and the link 42 to be the same. The angle co-adjusting mechanism (not shown) includes, e.g., a gear, a belt, or the like. Accordingly, the link mechanism can extend and contract while maintaining the direction of the end effector 50 by changing the gap between the rotation shafts 43 and 44 (i.e., the gap between the bases 31 and 32).

In this example, the end effector 50 is connected to the link mechanism (links 41 and 42). By connecting the two bases 31 and 32 with the end effector 50 via the link mechanism (links 41 and 42), the end effector 50 can be located at a retracted position shown in FIG. 8A and an extended position shown in FIG. 8B.

In other words, at the retracted position shown in FIG. 8A, the distance between the bases 31 and 32 is D1, and an extension distance H1 of the end effector 50 is uniquely determined. Further, at the extended position shown in FIG. 8B, the distance between the bases 31 and 32 is D2, and the extension distance H2 of the end effector 50 is uniquely determined.

The gap between the bases 31 and 32 is the gap between the reference position of the base 31 and the reference position of the base 32. In this example, the gap between the bases 31 and 32 is the gap between the rotation shafts 43 and 44. The extension distance is the distance between a straight line that connects the rotation shaft 43 of the base 31 with the rotation shaft 44 of the base 32 and the center of the wafer W placed on the end effector 50. If necessary, stoppers 47 and 48 for limiting the rotation angles of the links 41 and 42, respectively, are provided.

In the transfer unit 20' configured as described above, the bases 31 and 32 are magnetically levitated by generating the magnetic field that repels the permanent magnets 35 by controlling the current supplied from the linear driver 13 of the planar motor (linear unit) 10 to the electromagnetic coils 12 using the planar motor controller 72. By individually controlling the current supplied to the electromagnetic coils 12 in a state where the bases 31 and 32 are magnetically levitated, it is possible to move the bases 31 and 32 along the surface of the main body 11 of the planar motor 10 (the bottom surface of the vacuum transfer chamber 120), and control the positions of the bases 31 and 32. Accordingly, the transfer unit 20' can be moved and rotated.

Further, the extension distance of the end effector 50 can be changed by controlling the current supplied to the electromagnetic coils 12 such that the gap between the bases 31 and 32 becomes a desired gap. For example, in the case of accessing the processing chamber 110 or the load-lock chamber 130, the gap between the bases 31 and 32 is reduced to increase the extension distance of the end effector 50 as shown in FIG. 8B. Accordingly, the end effector 50 can be inserted into the processing chamber 110 or the load-lock chamber 130 in a state where the bases 31 and 32 are located on the surface of the main body 11 of the planar motor 10 (the bottom surface of the vacuum transfer chamber 120). Further, in the case of moving and rotating the transfer unit 20' in the vacuum transfer chamber 120, for example, the gap between the bases 31 and 32 is increased to reduce the extension distance of the end effector 5 as shown in FIG. 8A.

Accordingly, the end effector 50 holding the wafer W can be positioned close to the bases 31 and 32, and the misalignment of the wafer W that is being transferred can be reduced by suppressing sagging and vibration of the link mechanism (the links 41 and 42).

In this example as well as the above example, the sensor elements 61 of the wafer detection sensor 60 are disposed at the portions in the vacuum transfer chamber 120 corresponding to the wafer loading/unloading port of each processing chamber 110, and the position of the wafer W is detected by the sensor element 61 at the time of transferring the wafer W on the end effector 50 to the placement table 111 of the processing chamber 110. Then, based on the detection data, the calculator 71 of the transfer controller 70 calculates the position of the wafer W on the actual end effector, and calculates the correction values from the logical position of the wafer position based on the calculation result. The planar motor controller 72 corrects the transfer position of the wafer W on the placement table 111 of the processing chamber 110 based on the correction values, and controls the linear driver 13 to transfer the wafer W to the corrected transfer position.

Accordingly, the wafer W can be transferred with high positioning accuracy to a preset transfer position on the placement table 111 in the processing chamber 110.

OTHER APPLICATIONS

While the embodiments of the present disclosure have been described, the embodiments of the present disclosure are illustrative in all respects and are not restrictive. The above-described embodiments may be omitted, replaced, or changed in various forms without departing from the scope of the appended claims and the gist thereof.

For example, in the above embodiment, the transfer unit of the substrate processing system has one base or two bases. However, the transfer unit may have three or more bases. Further, in the case of providing the link mechanism between the base and the end effector, an articulated link mechanism may be used, or combination of a link mechanism displaced in a horizontal direction and a link mechanism displaced in a height direction may be used.

Further, in the above embodiment, the target transfer position of the wafer is set on the placement table of the processing chamber, but the target transfer position of the wafer is not limited thereto.

Further, in the above embodiment, the optical sensor in which the sensor element has the light emitting element and the light receiving element was used as the wafer detection sensor. However, the present disclosure is not limited thereto.

Further, although the case in which the semiconductor wafer (wafer) is used as the substrate has been described, the substrate is not limited to the semiconductor wafer, and may be another substrate such as a flat panel display (FPD) substrate, a quartz substrate, a ceramic substrate, or the like.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate transfer apparatus for transferring a substrate, comprising:
    a transfer unit including a substrate holder configured to hold a substrate, and a base having therein a magnet and configured to move the substrate holder;
    a planar motor including a main body, a plurality of electromagnetic coils disposed in the main body, and a linear driver configured to supply a current to the electromagnetic coils, and magnetically levitate and linearly drive the base;
    a substrate detection sensor configured to detect the substrate when the substrate held by the substrate holder passes by; and
    a transfer controller configured to calculate an actual position of the substrate held by the substrate holder based on detection data of the substrate detection sensor, calculate correction values for a logical position that has been set, and correct a transfer position of the substrate based on the correction values,
    wherein the transfer unit has two bases and further includes a link mechanism configured to connect each of the bases and the substrate holder, and
    an extension distance of the substrate holder is changed by controlling the current supplied to the electromagnetic coils such that a gap between the bases becomes a desired gap.

2. The substrate transfer apparatus of claim 1, wherein the transfer controller calculates a physical center of the substrate held by the substrate holder as the actual position of the substrate, and calculates correction values for a logical center of the substrate that has been set as the logical position.

3. The substrate transfer apparatus of claim 1, wherein the substrate transfer apparatus is disposed in a transfer chamber connected to a processing chamber for processing a substrate and is configured to transfer the substrate to the processing chamber, and
    the main body of the planar motor constitutes a bottom wall of the transfer chamber.

4. The substrate transfer apparatus of claim 3, wherein the substrate detection sensor is disposed at a position in the transfer chamber corresponding to a substrate loading/unloading port of the processing chamber, and detects the substrate at the time of transferring the substrate holder holding the substrate to the processing chamber.

5. A substrate transfer method for transferring a substrate using a substrate transfer apparatus,
    the substrate transfer apparatus including:
    a transfer unit including a substrate holder configured to hold a substrate and a base having therein a magnet and configured to move the substrate holder; and
    a planar motor including a main body, a plurality of electromagnetic coils disposed in the main body, and a linear driver configured to supply a current to the electromagnetic coils, and magnetically levitate and linearly drive the base,
    wherein the transfer unit has two bases and further includes a link mechanism configured to connect each of the bases and the substrate holder, and
    an extension distance of the substrate holder is changed by controlling the current supplied to the electromagnetic coils such that a gap between the bases becomes a desired gap, and
    the substrate transfer method comprising:

detecting the substrate at the time of transferring the substrate held by the substrate holder using a substrate detection sensor;

calculating an actual position of the substrate held by the substrate holder based on detection data of the substrate detection sensor and calculating the actual position of the substrate for a logical position that has been set; and correcting the transfer position of the substrate based on the correction values.

6. The substrate transfer method of claim 5, wherein a physical center of the substrate held by the substrate holder is calculated as the actual position of the substrate, and the correction values for a logical center of the substrate that has been set as the logical position are calculated.

7. The substrate transfer method of claim 5, wherein the substrate transfer apparatus is disposed in a transfer chamber connected to a processing chamber for processing a substrate, and transfers the substrate to the processing chamber, wherein the main body of the planar motor constitutes a bottom wall of the transfer chamber.

8. The substrate transfer method of claim 7, wherein the substrate detection sensor is disposed at a position in the transfer chamber corresponding to the substrate loading/unloading port of the processing chamber, and detects the substrate at the time of transferring the substrate holder holding the substrate to the processing chamber.

9. A substrate processing system comprising:
a processing chamber for processing a substrate;
a transfer chamber connected to the processing chamber; and
a substrate transfer apparatus disposed in the transfer chamber and configured to transfer the substrate to a transfer position in the processing chamber,
wherein the substrate transfer apparatus includes:
a transfer unit including a substrate holder configured to hold the substrate and a base having therein a magnet and configured to move the substrate holder;
a planar motor including a main body, a plurality of electromagnetic coils disposed in the main body, and a linear driver configured to supply a current to the electromagnetic coils, and magnetically levitate and linearly drive the base;
a substrate detection sensor configured to detect the substrate when the substrate held by the substrate holder passes by; and
a transfer controller configured to calculate an actual position of the substrate held by the substrate holder based on detection data of the substrate detection sensor, calculate correction values for a logical position that has been set, and correct a transfer position of the substrate based on the correction values,
wherein the transfer unit has two bases and further includes a link mechanism configured to connect each of the bases and the substrate holder, and
an extension distance of the substrate holder is changed by controlling the current supplied to the electromagnetic coils such that a gap between the bases becomes a desired gap.

10. The substrate processing system of claim 9, wherein the transfer controller calculates a physical center of the substrate held by the substrate holder as the actual position of the substrate, and calculates correction values for a logical center of the substrate that has been set as the logical position.

11. The substrate processing system of claim 9, wherein the main body of the planar motor constitutes a bottom wall of the transfer chamber.

12. The substrate processing system of claim 9, wherein the substrate detection sensor is disposed at a position corresponding to a substrate loading/unloading port of the processing chamber.

* * * * *